United States Patent

Yamamoto et al.

[11] Patent Number: 6,043,714
[45] Date of Patent: Mar. 28, 2000

[54] POWER AMPLIFIER INCORPORATING HETEROJUNCTION AND SILICON BIPOLAR TRANSISTORS

[75] Inventors: Kazuya Yamamoto; Yukio Miyazaki, both of Tokyo, Japan

[73] Assignee: Mitsubishi Denki Kabushiki Kaisha, Tokyo, Japan

[21] Appl. No.: 09/045,793

[22] Filed: Mar. 23, 1998

[30] Foreign Application Priority Data

Nov. 27, 1997 [JP] Japan .................................... 9-325655

[51] Int. Cl.$^7$ ........................................................ H03F 3/04
[52] U.S. Cl. ............................ 330/296; 330/299; 330/300
[58] Field of Search ...................................... 330/296, 299, 330/300

[56] References Cited

U.S. PATENT DOCUMENTS 4,027,271  5/1977  Cave et al. ................................ 330/296
4,122,401  10/1978  Sauer ....................................... 330/296

FOREIGN PATENT DOCUMENTS 746051  2/1995  Japan .

*Primary Examiner*—Michael B Shingleton
*Attorney, Agent, or Firm*—Leydig, Voit & Mayer, Ltd.

[57] ABSTRACT

A power amplifier including an amplifier stage including a heterojunction bipolar transistor for signal amplification having a base electrode connected to an RF signal input terminal, and a grounded emitter electrode; and a bias circuit including a silicon bipolar transistor having a base electrode connected to a power supply terminal, and a terminal from which a current amplified in response to a base current is output, which terminal is connected to the base electrode of the heterojunction bipolar transistor stage. In this power amplifier, since the voltage required for operating the bias circuit is reduced, a power amplifier capable of operating at a low voltage is realized.

5 Claims, 6 Drawing Sheets

POWER AMPLIFIER INCORPORATING HETEROJUNCTION AND SILICON BIPOLAR TRANSISTORS

FIELD OF THE INVENTION

The present invention relates to a power amplifier having an amplifier stage comprising an AlGaAs/GaAs heterojunction bipolar transistor (hereinafter referred to as an HBT), and a bias circuit for the power amplifier.

BACKGROUND OF THE INVENTION

As power amplifiers for mobile communication in recent years, MMICs (Microwave Monolithic Integrated Circuits), hybrid ICs, and multichip modules, including GaAs FETs (Field Effect Transistors) or AlGaAs/GaAs HBTs, have generally been employed. It is to be noted that an AlGaAs/GaAs HBT is an HBT having an AlGaAs active layer on a GaAs substrate.

Particularly an AlGaAs/GaAs HBT is expected as a power element for future mobile communication because it has the following advantages over the conventional FET.

(1) An AlGaAs/GaAs HBT does not require a negative gate bias voltage, i.e., it is operated with a single power supply.

(2) The HBT is able to perform ON/OFF operation without using a drain switch like an Si-MOSFET.

(3) Since the power density of the HBT is high, the same output power is obtained with reduced chip size as compared with an FET power amplifier.

However, in contrast with an FET, an HBT is operated by a base current applied thereto, and a base current of several tens to several hundreds of milliampere (mA) is required for an output power of 2~4W. Hence, in a power amplifier having an HBT element in an amplifier stage, such a base current must be applied to the HBT element. However, it is difficult to obtain such a current from a reference voltage supply unit, such as an LSI comprising a standard Si-CMOS, disposed in the previous stage of the power amplifier, because, in a standard Si-CMOS, an output current value that secures a specific output voltage is lower than 1 mA. Accordingly, in the power amplifier having an HBT element in the amplifier stage, the structure of a bias current for supplying a bias current to the amplifier stage is important.

Especially in portable telephone systems, such as Europe GSMC (Global Special of Mobile Communication) or CDMA (Code Division Multiple Access) systems, for which use of a power amplifier having an HBT element in an amplifier stage is expected, it is necessary to reduce the current level in idle time of the power amplifier for long life of batteries.

FIG. 6 shows input-output characteristics of the power amplifier having an HBT in the amplifier stage. In FIG. 6, $P_{in}$ is the input power to the power amplifier, $P_{out}$ is the output power from the power amplifier, $I_C$ is the collector current flowing in the HBT, $I_B$ is the base current of the HBT, and $I_{B1}$ is the base current in idle time. As shown in FIG. 6, it is desired that the base current $I_{B1}$ in idle time is reduced and the base current in amplification time is increased.

FIG. 7 is a circuit diagram illustrating an HBT power amplifier 200 having an amplifier stage including an AlGaAs/GaAs HBT. The power amplifier 200 comprises a bias circuit 200a and an amplifier stage 200b. The bias circuit 200a includes HBTs $Tr_{201}$ and $Tr_{202}$, and the amplifier stage 200b includes an HBT $Tr_A$. In FIG. 7, $RF_{in}$ denotes an input terminal of an RF (radio frequency) signal, $RF_{out}$ denotes an output terminal of the RF signal, $V_{CC}$ denotes a power supply voltage, $V_{ref}$ denotes a voltage for bias setting obtained by resistance division of the power supply voltage $V_{CC}$, $L_1$ denotes a matching inductor, $C_1$ and $C_2$ denote matching capacitors, $L_C$ denotes an RF choke inductor for RF separation between the bias circuit 200a and the amplifier stage 200b, $I_{201}$~$I_{204}$ denote currents flowing in the bias circuit 200a, and $I_C$ denotes a collector current of the HBT $Tr_A$.

FIG. 8 is a circuit diagram illustrating another HBT power amplifier 300 having a GaAs HBT in an amplifier stage. In FIG. 8, the same reference numerals and characters as those shown in FIG. 7 designate the same or corresponding parts. The power amplifier 300 comprises a bias circuit 300a and an amplifier stage 300b which is identical to the amplifier stage 200b shown in FIG. 7. The bias circuit 300a includes HBTs $Tr_{301}$ to $Tr_{306}$. In the bias circuit 300a, $I_{301}$ and $I_{303}$~$I_{308}$ denote currents, and $R_1$ and $R_3$~$R_5$ denote resistors.

In the power amplifiers 200 and 300 each having an AlGaAs/GaAs HBT $Tr_A$ in the amplifier stage, since GaAs series HBTs similar to the HBT $Tr_A$ are used in the bias circuit, the HBTs in the bias circuit and the HBT in the amplifier stage can be fabricated simultaneously, whereby the bias circuit and the amplifier stage are integrated on the same GaAs substrate.

In the HBT power amplifier 200 shown in FIG. 7, since the HBT $Tr_{201}$ and the HBT $Tr_A$ are disposed between the bias setting voltage $V_{ref}$ of the bias circuit 200a and the emitter electrode of the HBT in the amplifier stage 200b, base-to-emitter voltages of these two HBTs are accumulated. Since an AlGaAs/GaAs HBT requires a base-emitter voltage $V_{be}$ of 1.4~1.5V in its ON state, the bias setting voltage $V_{ref}$ of the bias circuit 200a must be at least 2.8V (=2×1.4) for normal operation. Since the bias setting voltage $V_{ref}$ is generated from the power supply voltage $V_{CC}$, the power supply voltage $V_{CC}$ must be at least 2.8V for normal operation.

Likewise, in the HBT power amplifier 300 shown in FIG. 8, since the HBT $Tr_{301}$ and the HBT $Tr_A$ are disposed between the power supply voltage $V_{CC}$ for bias control in the bias circuit 300a, and the emitter electrode of the HBT in the amplifier stage 300b, base-to-emitter voltages of these two HBTs are accumulated. Since an AlGaAs/GaAs HBT requires a base-emitter voltage $V_{be}$ of 1.4~1.5V in its ON state, the power supply voltage $V_{CC}$ of the bias circuit 300a must be at least 2.8V (=2×1.4) for normal operation.

Generally, in a portable telephone system operating at a power supply voltage of about 3V using a lithium ion (Li$^+$) battery, an NiCd battery or an NiMH battery, since the terminal voltages of these charging batteries are about 2.7V, the operating voltage of the power amplifier must be at least 2.7V. In the conventional power amplifier described above, however, because of the base-emitter voltage $V_{be}$ determined by the physical constant of the HBT, the bias circuit does not operate when the power supply voltage $V_{CC}$ is 2.7V.

As described above, in the conventional power amplifier, sufficient operation cannot be realized when the power supply voltage $V_{CC}$ is lower than 2.7V.

SUMMARY OF THE INVENTION

It is an object of the present invention to provide a power amplifier capable of operating at a low voltage, and a bias circuit for the power amplifier.

Other objects and advantages of the invention will become apparent from the detailed description that follows.

The detailed description and specific embodiments described are provided only for illustration since various additions and modifications within the scope of the invention will be apparent to those of skill in the art from the detailed description.

According to a first aspect of the present invention, there is provided a power amplifier comprising:

an amplifier stage including a heterojunction bipolar transistor for signal amplification having a base electrode connected to an RF signal input terminal, and an emitter electrode grounded; and a bias circuit including a first silicon bipolar transistor having a base electrode connected to a power supply terminal, and a terminal from which a current amplified in response to a base current is output, the terminal being connected to the base electrode of the heterojunction bipolar transistor included in the amplifier stage.

Therefore, the voltage required for operating the bias circuit is reduced, thereby providing a power amplifier capable of operating at a low voltage.

According to a second aspect of the invention, in the above-mentioned power amplifier, the first silicon bipolar transistor has an emitter electrode serving as the terminal from which an amplified current is output;

the bias circuit includes a heterojunction bipolar transistor having an emitter electrode grounded, and a base electrode and a collector electrode connected to each other and to the emitter electrode of the first silicon bipolar transistor; and the heterojunction bipolar transistor included in the bias circuit and the heterojunction bipolar transistor included in the amplifier stage have the same temperature characteristics with respect to the relationship between a base-emitter voltage and a collector current.

Therefore, a change in the collector current of the amplifier stage cue to temperature change can be compensated, resulting in stable operation of the power amplifier.

According to a third aspect of the present invention, in the above-mentioned power amplifier, the first silicon bipolar transistor has an emitter electrode serving as the terminal from which an amplified current is output, and a collector electrode connected to the power supply terminal;

the bias circuit further includes;

a second silicon bipolar transistor having an emitter electrode grounded, a base electrode connected to the base electrode of the first silicon bipolar transistor and connected through a resistor to the power supply terminal, and a collector electrode connected to the power supply terminal, and a heterojunction bipolar transistor having an emitter electrode grounded, a collector electrode connected to the base electrodes of the first and second silicon bipolar transistors, and a base electrode connected to the emitter electrode of the second silicon bipolar transistor; and the heterojunction bipolar transistor included in the bias circuit and the heterojunction bipolar transistor included in the amplifier stage have the same temperature characteristics with respect to the relationship between a base-emitter voltage and a collector current.

Therefore, a change in the collector current of the amplifier stage due to temperature change can be compensated with precision, resulting in stable operation of the power amplifier.

According to a fourth aspect of the present invention, in the above-mentioned power amplifier, the heterojunction bipolar transistor included in the amplifier stage is first conductivity type;

the first silicon bipolar transistor included in the bias circuit is second conductivity type and has an emitter electrode connected to the power supply terminal; and the bias circuit further includes;

a heterojunction bipolar transistor of the first conductivity type having an emitter electrode grounded, a base electrode connected to the base electrode of the heterojunction bipolar transistor of the amplifier stage, and a collector electrode connected to the base electrode, the collector electrode and the base electrode being connected to the collector electrode of the first silicon bipolar transistor, and a second silicon bipolar transistor of the second conductivity type having a collector electrode connected to the power supply terminal, an emitter electrode connected to a constant current source, and a base electrode connected to the base electrode of the first silicon bipolar transistor and to the emitter electrode.

Therefore, the voltage required for operating the bias circuit is reduced, thereby providing a power amplifier capable of operating at a low voltage.

According to a fifth aspect of the present invention, in the above-mentioned power amplifier, the constant current source has such current characteristics that the output current value is proportional to the temperature. Therefore, change in the collector current of the amplifier stage is kept constant against the temperature change.

According to a sixth aspect of the present invention, in the above-mentioned power amplifier, the constant current source has such temperature characteristics that the output current value does not change according to the temperature. Therefore, the gain of the heterojunction bipolar transistor in the amplifier stage can be controlled constantly against the temperature chance.

According to a seventh aspect of the present invention, in the above-mentioned power amplifier, the heterojunction bipolar transistor included In the amplifier stage is first conductivity type;

the first silicon bipolar transistor included in the bias circuit is second conductivity type and has a collector electrode connected to the power supply terminal; and the bias circuit further includes;

a heterojunction bipolar transistor of the first conductivity type having an emitter electrode grounded, a base electrode connected to the base electrode of the heterojunction bipolar transistor of the amplifier stage, and a collector electrode connected to the base electrode, the collector electrode and the base electrode being connected to the emitter electrode of the first silicon bipolar transistor, a second silicon bipolar transistor of the second conductivity type having a collector electrode, an emitter electrode connected to the power supply terminal, and a base electrode connected to the base electrode of the first silicon bipolar transistor, a third silicon bipolar transistor of the second conductivity type having a collector electrode, an emitter electrode connected to the power supply terminal, and a base electrode connected to the base electrodes of the first and second silicon bipolar transistors, a fourth silicon bipolar transistor of the first conductivity type having a collector electrode connected to the collector electrode of the second silicon bipolar transistor, an emitter electrode grounded through a resistor, and a base electrode connected to the collector electrode of the third silicon bipolar transistor, and a fifth silicon bipolar transistor of the first conductivity type having an emitter electrode grounded, and a collector electrode and a base electrode connected to each other and to the collector electrode of the third silicon bipolar transistor.

Therefore, the gain of the heterojunction bipolar transistor in the amplifier stage can be kept constant against the change in the power supply voltage and the temperature change.

According to an eighth aspect of the present invention, in the above-mentioned power amplifier, the heterojunction bipolar transistor included in the amplifier stage is first conductivity type;

the first silicon bipolar transistor included in the bias circuit is second conductivity type and has an emitter electrode connected to the power supply terminal; and the bias circuit includes;

a heterojunction bipolar transistor of the first conductivity type having an emitter electrode grounded, a base electrode connected to the base electrode of the heterojunction bipolar transistor of the amplifier stage, and a collector electrode connected to the base electrode, the collector electrode and the base electrode being connected to the collector electrode of the first silicon bipolar transistor, a second silicon bipolar transistor of the second conductivity type having an emitter electrode connected to the power supply terminal, and a collector electrode and a base electrode connected to each other, a third silicon bipolar transistor of the first conductivity type having a base electrode, a collector electrode connected to the collector electrode of the second silicon bipolar transistor, and an emitter electrode grounded through a resistor, a constant band gap voltage circuit that outputs a band gap voltage, and an operational amplifier having an output terminal connected to the base electrode of the third silicon bipolar transistor, a first input terminal connected to the emitter electrode of the third silicon bipolar transistor, and a second input terminal to which an output from the constant band gap voltage circuit is input.

Therefore, the gain of the heterojunction bipolar transistor in the amplifier stage can be kept constant against the change in the power supply voltage and the temperature change.

According to a ninth aspect of the present invention, in the above-mentioned power amplifier, the bias circuit further comprises a silicon bipolar transistor of the first conductivity type having an emitter electrode connected to the base electrode of the heterojunction bipolar transistor, a base electrode connected to the collector electrode of the heterojunction bipolar transistor, and a collector electrode connected to the power supply terminal. Therefore, reduced power consumption is realized.

According to a tenth aspect of the present invention, there is provided a bias circuit used for a power amplifier having an amplifier stage including a heterojunction bipolar transistor for signal amplification, the transistor having a base electrode connected to an RF signal input terminal, and an emitter electrode grounded, and the bias circuit includes a silicon bipolar transistor having a base electrode connected to a power supply terminal, and a terminal from which a current amplified in response to a base current is output, the terminal being connected to the base electrode of the heterojunction bipolar transistor included in the amplifier stage. Therefore, the voltage required for operation is reduced, thereby providing a power amplifier capable of operating at a low voltage.

DETAILED DESCRIPTION OF THE PREFERRED EMBODIMENTS

[Embodiment 1]

Figure 1:
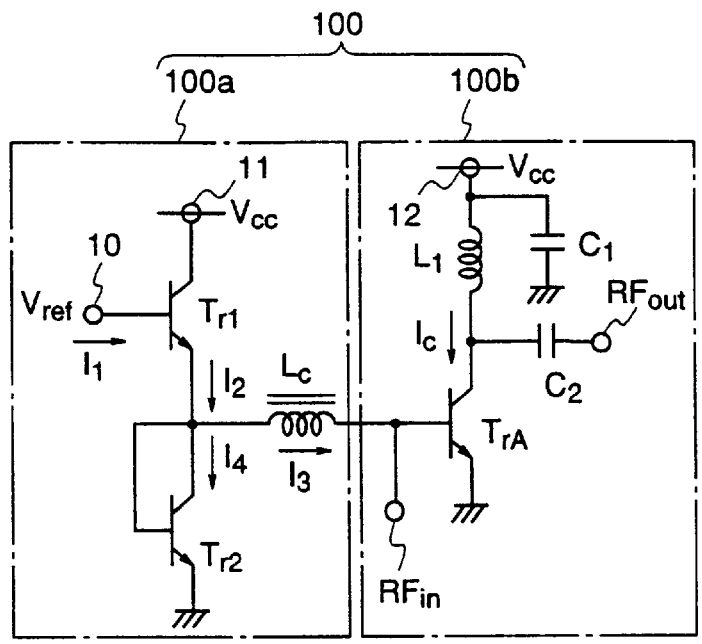
FIG. 1 is a circuit diagram illustrating a power amplifier according to a first embodiment of the present invention.

FIG. 1 is a circuit diagram illustrating a power amplifier 100 according to a first embodiment of the present invention. The power amplifier 100 comprises a bias circuit 100a and an amplifier stage 100b. The amplifier stage 100b includes an NPN type HBT $Tr_A$ for signal amplification having a base electrode which is connected to an input terminal $RF_{in}$ to which an RF (Radio Frequency) signal is applied, and connected through an RF choke conductor $L_C$ to an output terminal of the bias circuit 100a. The RF choke conductor $L_C$ is used for RF-separation between the bias circuit 100a and the amplifier stage 100b. A collector electrode of the HBT $Tr_A$ is connected to an end of a matching inductor $L_1$. The other end of the matching inductor $L_1$ is connected to a power supply terminal 12 to which a power supply voltage $V_{CC}$ is applied, and it is grounded through a matching capacitor $C_1$. This collector electrode is connected through a matching capacitor $C_2$ to an output terminal $RF_{out}$ from which the RF signal amplified by the HBT $Tr_A$ is output.

The bias circuit 100a includes an NPN type silicon bipolar transistor $Tr_1$ (hereinafter referred to simply as an Si bipolar transistor) having a base electrode connected to a bias setting terminal 10 to which a bias setting voltage $V_{ref}$ is applied, a collector electrode connected to a power supply terminal 11 to which a power supply voltage $V_{CC}$ is applied, and an emitter electrode serving as an output terminal of a bias current. The bias circuit 100a further includes an NPN type HBT $Tr_2$ having an emitter electrode grounded, and a base electrode and a collector electrode which are connected to each other and to the emitter electrode of the Si bipolar transistor $Tr_1$. The HBT $Tr_2$ has the same temperature characteristics with respect to the relationship between the base-emitter voltage and the collector current as the HBT $Tr_A$ for signal amplification. In this first embodiment, the HBT $Tr_2$ and the HBT $Tr_A$ are simultaneously fabricated on the same substrate so that these HBTs have the same temperature characteristics. The bias setting voltage $V_{ref}$ is obtained by, for example, resistance division of the power supply voltage $V_{CC}$ and, therefore, the base electrode of the Si bipolar transistor $Tr_1$ is actually connected through a resistor or the like to the power supply voltage $V_{CC}$. The bias setting voltage $V_{ref}$ may be generated from the power supply voltage $V_{CC}$ in the bias circuit 100a. Further, $I_1$ to $I_4$ denote currents flowing in the bias circuit 100a, and $I_C$ denotes a collector current of the HBT $Tr_A$.

A description is now given of the operation of the power amplifier. When an RF signal is input through the terminal $RF_{in}$ to the amplifier stage 100b, the RF signal is applied to the base electrode of the HBT $Tr_A$, and the collector current $I_C$ of the HBT $Tr_A$ and the collector-emitter voltage thereof are amplified in response to the magnitude of the RF signal. Then, the amplified signal (power) is output from the terminal $RF_{out}$.

In the bias circuit 100a, the bias setting voltage $V_{ref}$ is applied to the base electrode of the Si bipolar transistor $Tr_1$, and the current $I_2$ which is amplified in response to the magnitude of the voltage $V_{ref}$ is output as an emitter current of the Si bipolar transistor $Tr_1$. Since the base electrode and the collector electrode of the HBT $Tr_2$ are connected to each other, the HBT $Tr_2$ has a structure similar to a diode and serves as a resistor. The emitter current $I_2$ of the Si bipolar transistor $Tr_1$ is divided into two streams, i.e., a current $I_4$ flowing toward the HBT $Tr_2$ and a current $I_3$ flowing toward the amplifier stage 100b, in response to a bias current requested by the HBT $Tr_A$ in the amplifier stage 100b. The current $I_3$ is supplied as a bias current to the HBT $Tr_A$ in the amplifier stage 100b.

In this first embodiment, the bias circuit 100a includes the Si bipolar transistor $Tr_1$, and this transistor has a base electrode connected to the power supply terminal, and a terminal from which a current amplified in response to the base current is output, connected to the base electrode of the HBT $Tr_A$ in the amplifier stage 100b. Usually, an Si bipolar transistor has a base-emitter voltage $V_{be}$ of 0.7~0.9V. In the bias circuit 100a, the base-emitter voltage $V_{be}$ of the Si bipolar transistor $Tr_1$ is disposed between the terminal 10 to which the bias setting voltage $V_{ref}$ is applied and the amplifier stage 100b. Therefore, the lowest operating voltage of the HBT $Tr_A$ in the amplifier stage 100b is represented by the total of the base-emitter voltages $V_{be}$ of the transistors $Tr_1$ and $Tr_A$, i.e., $V_{ref}$=1.4+0.7=2.1V, so that the HBT $Tr_A$ can operate even when the power supply voltage $V_{CC}$ is lower than 2.7. As a result, sufficient operation is realized even in a portable telephone system or the like that is not supplied with a high power supply voltage.

Furthermore, the bias circuit 100a includes the HBT $Tr_2$ having the same temperature characteristics with respect to the relationship between the base-emitter voltage $V_{be}$ and the collector current as the HBT $Tr_A$ included in the amplifier stage 100b. Therefore, even when the temperature of the amplifier rises due to heat generation during power amplification and the base-emitter voltage $V_{be}$ providing a predetermined collector current $I_C$ of the HBT $Tr_A$ in the amplifier stage 100b decreases, since the base-emitter voltage $V_{be}$ providing a predetermined collector current of the HBT $Tr_2$ in the bias circuit 100a decreases with the decrease in the base-emitter voltage $V_{be}$ of the HBT $Tr_A$, the collector current flowing into the HBT $Tr_2$ increases. Accordingly, the bias current applied to the base electrode of the HBT $Tr_A$ decreases, and the collector current $I_C$ of the HBT $Tr_A$ decreases. As a result, the change in the collector current $I_C$ due to the temperature change is compensated, resulting in stable operation.

As described above, according to the first embodiment of the invention, the bias circuit 100a includes the Si bipolar transistor $Tr_1$ having a base electrode connected to the power supply terminal, and an emitter terminal, from which a current amplified in response to the base current is output, connected to the base electrode of the HBT $Tr_A$ in the amplifier stage 100b. Therefore, the voltage required for operating the bias circuit 100a is reduced, resulting in a power amplifier capable of operating at a low voltage.

[Embodiment 2]

Figure 2:
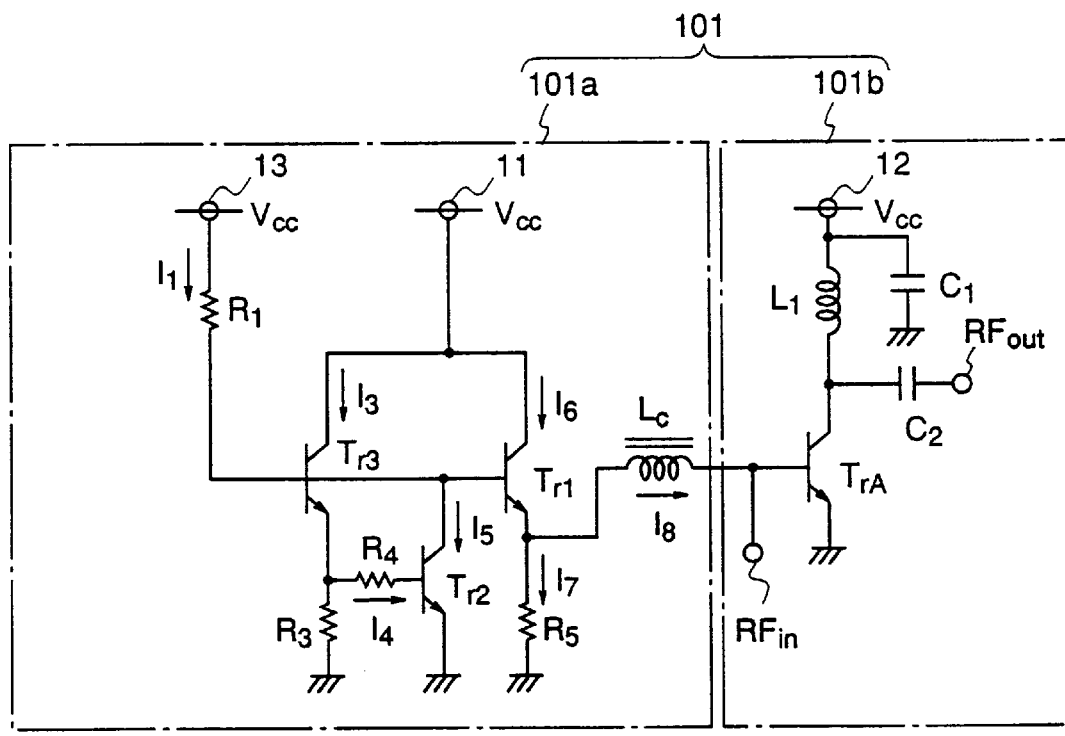
FIG. 2 is a circuit diagram illustrating a power amplifier according to a second embodiment of the present invention.

FIG. 2 is a circuit diagram illustrating a power amplifier 101 according to a second embodiment of the present invention. In FIG. 2, the same reference numerals as those shown in FIG. 1 designate the same or corresponding parts. The power amplifier 101 comprises a bias circuit 101a and an amplifier stage 101b which is identical to the power amplifier 100b shown in FIG. 1. The bias circuit 101a includes first and second Si bipolar transistors $Tr_1$ and $Tr_3$, collector electrodes of which are connected to the power supply terminal 11, base electrodes of which are connected to each other, and emitter electrodes of which are grounded through resistors $R_3$ and $R_5$, respectively. The emitter electrode of the second Si bipolar transistor $Tr_3$ is connected through a resistor $R_4$ to the base electrode of the HBT $Tr_2$, and the base electrode thereof is connected to the collector electrode of the HBT $Tr_2$. The emitter electrode of the HBT $Tr_2$ is grounded. The HBT $Tr_2$ has the same temperature characteristics with respect to the relationship between the base-emitter voltage and the collector current as the HBT $Tr_A$ included in the amplifier stage 101b. The emitter electrode of the first Si bipolar transistor $Tr_1$ is connected through the RF choke inductor $L_C$ to the base electrode of the HBT $Tr_A$ in the amplifier stage 101b. The base electrodes of the Si bipolar transistors $Tr_1$ and $Tr_3$, which are connected to each other, are connected through the resistor $R_1$ to the power supply terminal 13 to which the power supply voltage $V_{CC}$ is applied. Reference characters $I_1$ and $I_3$~$I_8$ denote currents flowing in the bias circuit 101a, and reference characters $R_3$~$R_5$ denote resistors.

A description is given of the operation of the power amplifier.

In the amplifier stage 101b, like the amplifier stage 100b according to the first embodiment, when an RF signal is input to the terminal $RF_{in}$, a power amplified by the HBT $Tr_A$ is output from the terminal $RF_{out}$.

In the bias circuit 101a, the power supply voltage $V_{CC}$ is applied through the resistor $R_1$ to the base electrode of the first Si bipolar transistor $Tr_1$, and the emitter current amplified by the first Si bipolar transistor $T_1$ is divided into two streams, i.e., a current $I_8$ flowing toward the HBT $Tr_2$ and a current $I_7$ flowing toward the amplifier stage 101b, in response to the bias current required for amplification of the HBT $Tr_A$ in the amplifier stage 101b. The current $I_7$ is supplied as a bias current to the HBT $Tr_A$ in the amplifier stage 101b.

In this second embodiment, the bias circuit 101a includes the Si bipolar transistor $Tr_1$ disposed between the power supply terminal 13 and the amplifier stage 101b. Since the base-emitter voltage $V_{be}$ of the Si bipolar transistor is usually 0.7~0.9V, the lowest operating voltage of the power amplifier is $V_{be}$=1.4+0.7=2.1V, so that the power amplifier can operate even when the power supply voltage $V_{CC}$ is lower than 2.7V. Accordingly, sufficient operation is realized even in a portable telephone or the like that is not supplied with a high power supply voltage.

Furthermore, in this second embodiment, the HBT $Tr_2$ included in the bias circuit 101a has the same temperature characteristics with respect to the relationship between the base-emitter voltage $V_{be}$ and the collector current as the HBT $Tr_A$ included in the amplifier stage 101b. Therefore, when the temperature of the amplifier rises due to heat generation during power amplification and this temperature rise decreases the base-emitter voltage $V_{be}$ providing a predetermined collector current $I_C$ of the HBT $Tr_A$ in the amplifier stage 101b, the collector current of the HBT $Tr_A$ becomes larger than that before the temperature change, and the HBT $Tr_A$ requests the base current increased in response to the collector current, to the first Si bipolar transistor $Tr_1$. In order to supply this, the bias current applied to the base electrode of the Si bipolar transistor $Tr_1$ increases. Since, like the HBT $Tr_A$, the base-emitter voltage $V_{be}$ providing a predetermined collector current of the HBT $Tr_2$ in the bias circuit 101a decreases with the temperature change, the collector current $I_5$ flowing into the HBT $Tr_2$ increases, and the current $I_C$ supplied from the terminal 13 increases. As a result, the voltage applied to the resistor $R_1$ increases, and the voltage applied to the base electrode of the second Si bipolar transistor $Tr_3$ decreases. Thereby, the voltage applied to the base electrode of the first Si bipolar transistor $Tr_1$ decreases, and the bias current applied to the HBT $Tr_A$ in the amplifier stage 101b decreases as well, leading to a reduction in the collector current $I_C$ of the HBT $Tr_A$. As a result, the change in the collector current $I_C$ due to temperature change is compensated with high precision, resulting in stable operation of the amplifier.

As described above, according to the second embodiment of the invention, the bias circuit 101a includes the following three transistors: a first Si bipolar transistor $Tr_1$ having a base electrode connected to the power supply terminal 13, and an emitter terminal connected to the base electrode of the HBT $Tr_A$ in the amplifier stage 101b and outputting a current amplified in response to the base current; a second Si bipolar transistor $Tr_3$ having a base electrode connected to the base electrode of the first Si bipolar transistor $Tr_1$ and connected through the resistor $R_1$ to the power supply terminal 13, a collector electrode connected to the power supply terminal 11, and an emitter electrode grounded; and an HBT $Tr_2$ having a collector electrode connected to the base electrodes of the first and second Si bipolar transistors $Tr_1$ and $Tr_2$, a base electrode connected to the emitter electrode of the second Si bipolar transistor $Tr_3$, and an emitter electrode grounded. The HBT $Tr_2$ has the same temperature characteristics with respect to the relationship between the base-emitter voltage and the collector current as the HBT $Tr_A$ in the amplifier stage 101b. Therefore, the voltage required for operating the bias circuit 101a is reduced, resulting in a power amplifier capable of operating at a low voltage.

[Embodiment 3]

Figure 3:
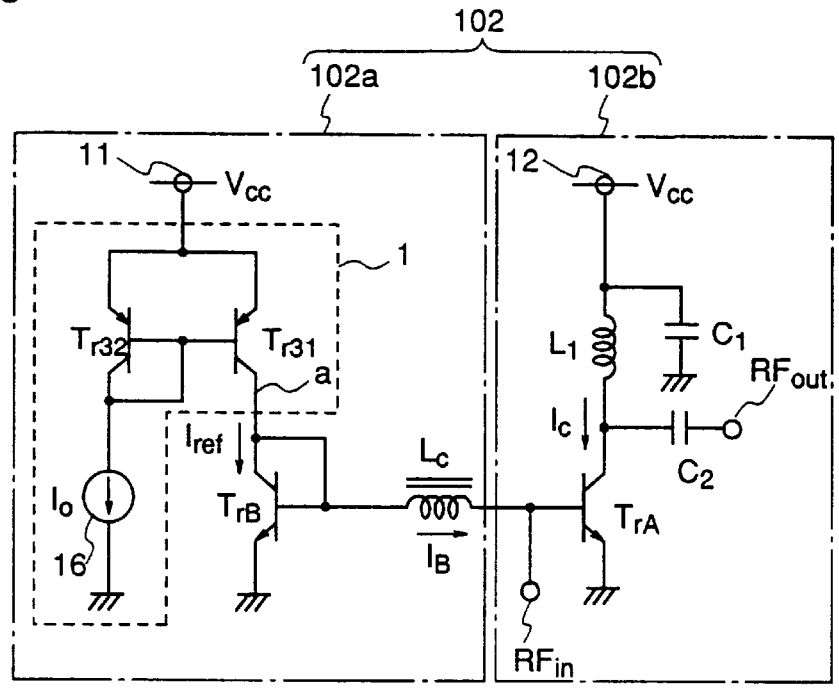
FIG. 3 is a circuit diagram illustrating a power amplifier according to a third embodiment of the present invention.

FIG. 3 is a circuit diagram illustrating a power amplifier 102 according to a third embodiment of the present invention. In FIG. 3, the same reference numerals as those shown in FIG. 1 designate the same or corresponding parts. The power amplifier 102 comprises a bias circuit 102a and an amplifier stage 102b which is identical to the amplifier stage 100b shown in FIG. 1.

The bias circuit 102a includes an NPN type HBT $Tr_B$, a first PNP type Si bipolar transistor $Tr_{31}$, and a second PNP type Si bipolar transistor $Tr_{32}$. The HBT $Tr_B$ has a base electrode connected to the base electrode of the HBT $Tr_A$ of the amplifier stage 102b, a collector electrode connected to the base electrode thereof, and an emitter electrode grounded. The second Si bipolar transistor $Tr_{32}$ has a base electrode, an emitter electrode to which the power supply voltage $V_{CC}$ is applied, and a collector electrode connected to the base electrode and to a constant current source 16 that outputs a constant current $I_o$. The first Si bipolar transistor $Tr_{31}$ has an emitter electrode connected to the power supply terminal 11, a base electrode connected to the base electrode of the second Si bipolar transistor $Tr_{32}$, and a collector electrode connected to the collector electrode of the HBT $Tr_B$. The base electrode of the first Si bipolar transistor $Tr_{31}$ is connected through the second Si bipolar transistor $Tr_{32}$ to the terminal 11 to which the power supply voltage $V_{CC}$ is applied. The constant current source 16 has the constant current ($I_o$) characteristics being proportional to the temperature or being constant against the temperature. The HBT $Tr_B$ in the bias circuit 102a and the HBT $Tr_A$ in the amplifier stage 102b form a pair of current mirrors. Likewise, the first and second Si bipolar transistors $Tr_{31}$ and $Tr_{32}$ form a pair of current mirrors. Reference character $I_{ref}$ is a current amplified by the current mirror pair of $Tr_{31}$ and $Tr_{32}$, a is a collector node voltage of the HBT $Tr_B$, and $I_B$ is the base current of the HBT $Tr_A$.

In this power amplifier, by the current mirror circuit comprising the Si bipolar transistors $Tr_{31}$ and $Tr_{32}$, a current $I_{ref}$=k $I_o$ (k: proportional constant) flows in the HBT $Tr_B$ according to the ratio of $Tr_{31}$ to $Tr_{32}$ in size. Further, by the current mirror circuit comprising the HBTs $Tr_A$ and $Tr_B$, a current $I_C$=A $I_{ref}$=A $I_o$ (A: proportional constant) flows as a collector current of the HBT $Tr_A$ according to the ratio of $Tr_A$ to $Tr_B$ in size.

Also in this third embodiment, as in the first embodiment of the invention, the Si bipolar transistor $Tr_{31}$ having a base-collector voltage smaller than that of an HBT is placed between the terminal 11 to which the power supply voltage $V_{CC}$ is applied and the amplifier stage 102b. Therefore, the power amplifier can operate even when the power supply voltage $V_{CC}$ is lower than 2.7V.

Further, when the power amplifier employs a constant current source 16 having the constant current ($I_o$) characteristics being proportional to the temperature, the collector current $I_C$ of the HBT $Tr_A$ in the amplifier stage 102b can be maintained constantly against the temperature change.

Furthermore, when the power amplifier employs a constant current source 16 having the constant current ($I_o$) characteristics being constant against the temperature, the gain of the HBT $Tr_A$ in the amplifier stage 102b can be controlled constantly against the temperature change.

[Embodiment 4]

Figure 4:
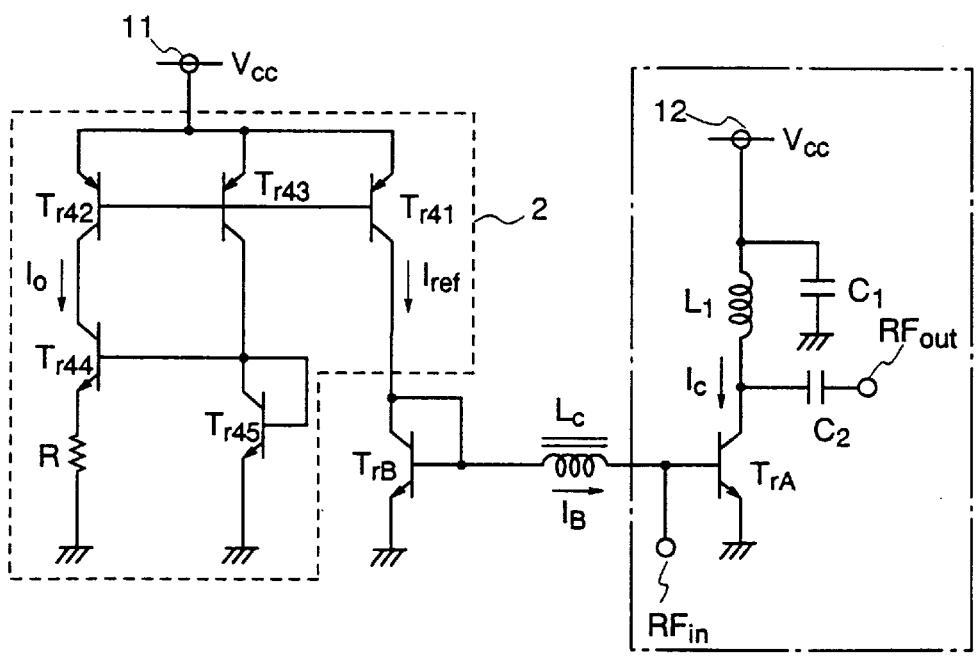
FIG. 4 is a circuit diagram illustrating a power amplifier according to a fourth embodiment of the present invention.

FIG. 4 is a circuit diagram illustrating a power amplifier according to a fourth embodiment of the invention. In the figure, the same reference numerals as those shown in FIG. 3 designate the same or corresponding parts. In place of the first circuit 1 comprising the Si bipolar transistors $Tr_{31}$ and $Tr_{32}$ and the constant current source 16 employed in the power amplifier according to the third embodiment, the power amplifier according to this fourth embodiment employs a second circuit 2 comprising a PNP type (second conductivity type) first Si bipolar transistor $Tr_{41}$, a PNP type second Si bipolar transistor $Tr_{42}$, a PNP type third Si bipolar transistor $Tr_{43}$, an NPN type (first conductivity type) fourth Si bipolar transistor $Tr_{44}$, and an NPN type fifth Si bipolar transistor $Tr_{45}$. More specifically, the PNP type first Si bipolar transistor $Tr_{41}$ has a base electrode, an emitter electrode connected to the power supply terminal 11, and a collector electrode connected to the collector electrode of the HBT $Tr_B$. The PNP type second Si bipolar transistor $Tr_{42}$ has an emitter electrode connected to the power supply terminal 11, a base electrode connected to the base electrode of the first Si bipolar transistor $Tr_{41}$, and a collector electrode. The PNP type third Si bipolar transistor $Tr_{43}$ has an emitter electrode connected to the power supply terminal 11, a base electrode connected to the base electrodes of the first and second Si bipolar transistors $Tr_{41}$ and $Tr_{42}$, and a collector electrode. The NPN type fourth Si bipolar transistor $Tr_{44}$ has a collector electrode connected to the collector electrode of the second Si bipolar transistor $Tr_{42}$, an emitter electrode grounded through a resistor R, and a base electrode connected to the collector electrode of the third Si bipolar transistor $Tr_{43}$. The NPN type fifth Si bipolar transistor $Tr_{45}$ has a base electrode, a collector electrode connected to the base electrode and to the collector electrode of the third Si bipolar transistor $Tr_{43}$, and an emitter electrode grounded.

Also in this fourth embodiment, like the third embodiment of the invention, the Si bipolar transistor $Tr_{41}$ having a base-collector voltage smaller than that of an HBT is placed between the terminal 11 to which the power supply voltage $V_{CC}$ is applied and the amplifier stage 102b. Therefore, the power amplifier can operate even when the power supply voltage $V_{CC}$ is lower than 2.7V.

Furthermore, in the circuit shown in FIG. 4, since the collector current $I_o$ of the second Si bipolar transistor $Tr_{42}$ is proportional to the temperature, the collector current $I_o$ and the collector current $I_{ref}$ of the first Si bipolar transistor, which is output in proportion to $I_o$, are controlled so as to have the characteristics proportional to the temperature, by the current mirror pair comprising $Tr_{41}$ and $Tr_{42}$. As a result, the collector current $I_C$ of the HBT $Tr_A$ in the amplifier stage 102b which is set in proportion to the collector current $I_{ref}$ by the current mirror pair comprising $Tr_A$ and $Tr_B$ can be controlled so that it has the characteristics proportional to the temperature. When the collector current $I_C$ is proportional to the temperature, the mutual inductance gm of the HBT $Tr_A$ can be maintain constantly against the temperature. Accordingly, the gain of the HBT $Tr_A$ can be maintain constantly against the change in the power supply voltage and the temperature change.

[Embodiment 5]

Figure 5:
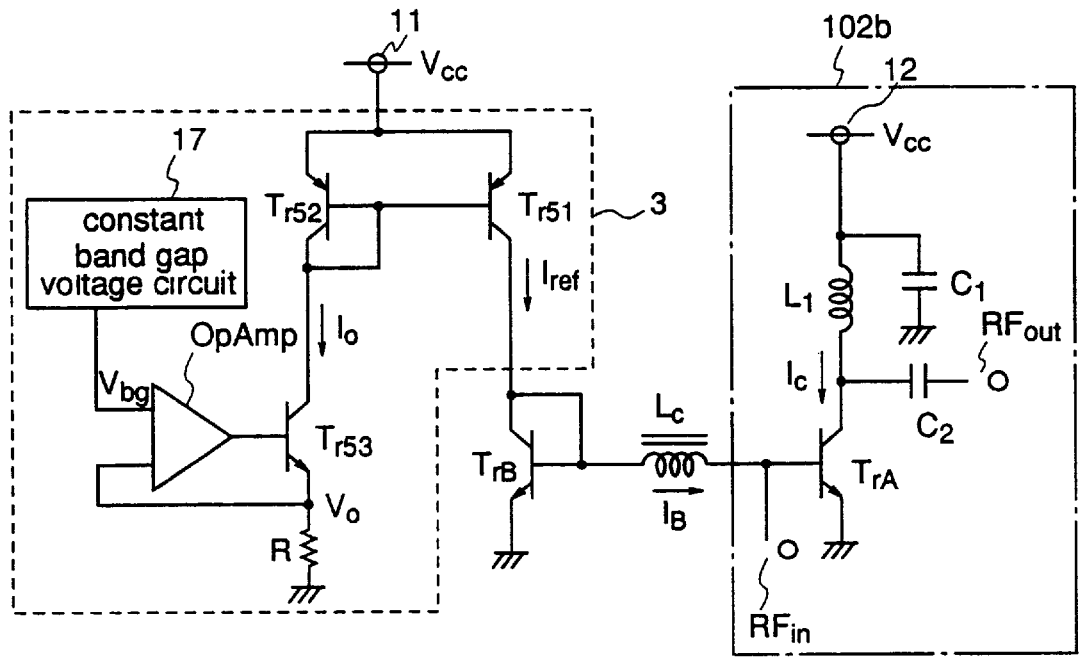
FIG. 5 is a circuit diagram illustrating a power amplifier according to a fifth embodiment of the present invention.
Figure 6:
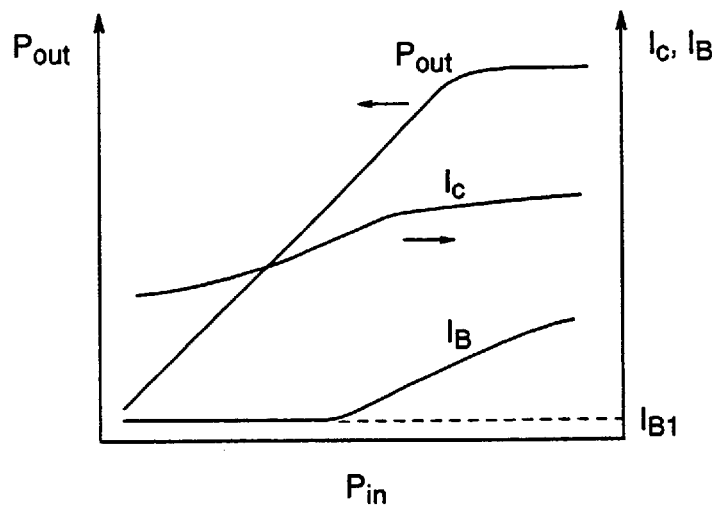
FIG. 6 is a diagram showing input-output characteristics of a power amplifier according to the prior art.
Figure 7:
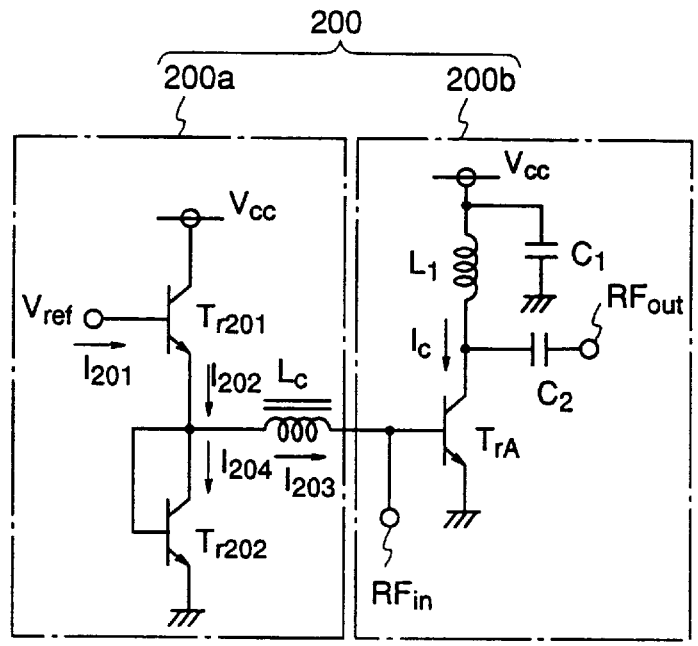
FIG. 7 is a circuit diagram illustrating a power amplifier according to the prior art.
Figure 8:
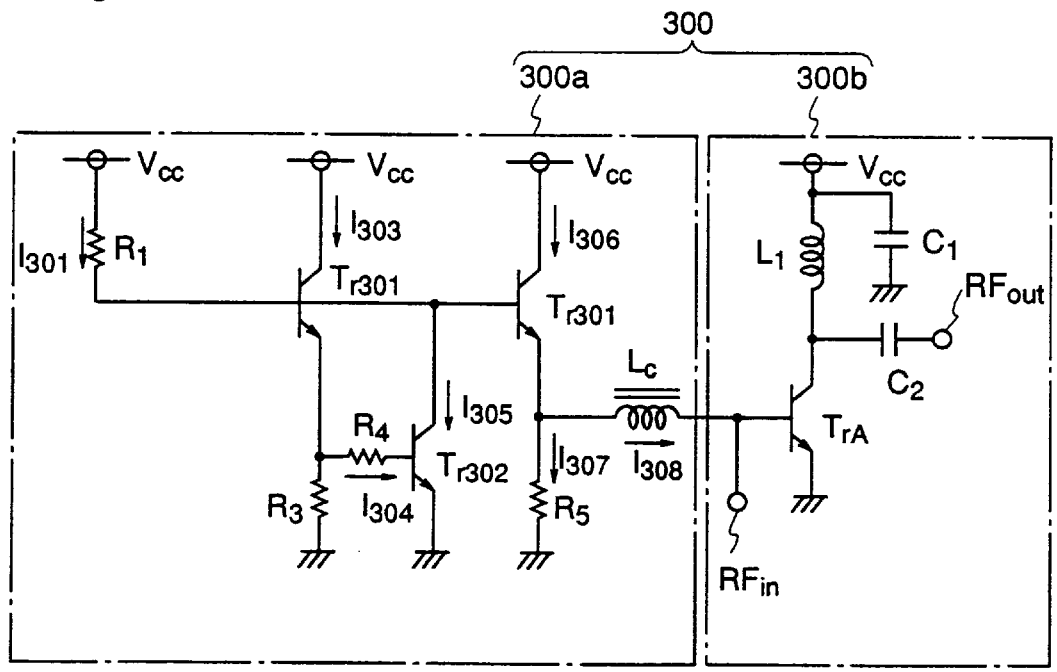
FIG. 8 is a circuit diagram illustrating another power amplifier according to the prior art.

FIG. 5 is a circuit diagram illustrating a power amplifier according to a fifth embodiment of the invention. In FIG. 5, the same reference numerals as those shown in FIG. 3 designate the same or corresponding parts. In place of the first circuit 1 comprising the Si bipolar transistors $Tr_{31}$ and $Tr_{32}$ and the constant current source 16 employed in the power amplifier according to the third embodiment, the power amplifier according to this fifth embodiment employs a third circuit 3 comprising a PNP type first Si bipolar transistor $Tr_{51}$, a PNP type second Si bipolar transistor $Tr_{52}$, an NPN type third Si bipolar transistor $Tr_{53}$, a constant band gap voltage circuit 17, and an operational amplifier OpAmp. More specifically, the PNP type first Si bipolar transistor $Tr_{51}$ has a base electrode, a collector electrode connected to the collector electrode of the HBT $Tr_B$, and an emitter electrode connected to the power supply terminal 11. The PNP type second Si bipolar transistor $Tr_{52}$ has an emitter electrode connected to the power supply terminal 11, and a collector electrode and a base electrode connected to etch and to the base electrode of the first Si bipolar transistor $Tr_{51}$. The NPN type third Si bipolar transistor $Tr_{53}$ has a base electrode, a collector electrode connected to the collector electrode of the second Si bipolar transistor $Tr_{52}$, and an emitter electrode grounded through a resistor R. The constant band gap voltage circuit 17 outputs a band gap voltage. The operational amplifier OpAmp has an output terminal connected to the base electrode of the third Si bipolar transistor $Tr_{53}$, a first input terminal connected to the emitter electrode of the third Si bipolar transistor $Tr_{53}$, and a second input terminal to which an output from the constant band gap voltage circuit 16 is input. For example, a differential amplifier is employed as the operational amplifier.

Also in this fifth embodiment, the Si bipolar transistor $Tr_{51}$ having a base-collector voltage smaller than that of an HBT is placed between the terminal 11 to which the power supply voltage $V_{CC}$ is applied and the amplifier stage 102b. Therefore, the power amplifier can operate even when the power supply voltage $V_{CC}$ is lower than 2.7V.

Furthermore, since the voltage output from the constant band gap voltage circuit 17 is independent of the temperature change and always constant, the voltage $V_o$ of a portion where the emitter electrode of the Si bipolar transistor $Tr_3$, the first input terminal of the operational amplifier OpAmp, and the resistor R are connected is constant regardless of the temperature. In addition, the collector current $I_o$ of the Si bipolar transistor $Tr_{52}$ is constant regardless of the temperature change. Therefore, the collector current $I_{ref}$ of the first Si bipolar transistor $Tr_{51}$ and the collector current $I_C$ of the HBT $Tr_A$ of the amplifier stage 102b can be kept constant regardless of the temperature change.

[Embodiment 6]

Figure 9:
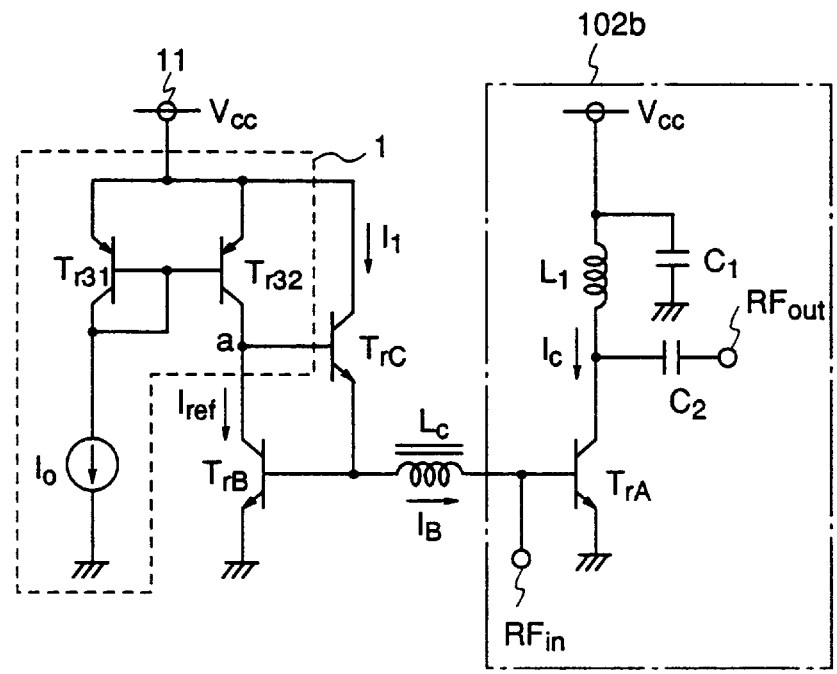
FIG. 9 is a circuit diagram illustrating a power amplifier according to a sixth embodiment of the present invention.

FIG. 9 is a circuit diagram illustrating a power amplifier according to a sixth embodiment of the invention. In FIG. 9 the same reference numerals as those shown in FIG. 3 designate the same or corresponding parts.

The power amplifier according to this sixth embodiment is identical to the power amplifier according to the third embodiment except that an NPN type Si bipolar transistor $Tr_C$ is added. The Si bipolar transistor $Tr_C$ has an emitter electrode connected to the base electrode of the HBT $Tr_B$ and a collector electrode connected to the power supply terminal 11. Also in this sixth embodiment, the same effects as those provided by the third embodiment are achieved.

Further, since the Si bipolar transistor $Tr_C$ is added, the current $I_1$ is supplied from the power supply $V_{CC}$ through the transistor $Tr_C$ in response to an increase in the base current of the HBT $Tr_A$ in the amplifier stage between the idle time and the amplification time. Thereby, the collector current $I_C$ of the HBT $Tr_A$ can be increased with the change from the idle time to the amplification time. In the power amplifier according to the third embodiment, since the collector current $I_C$ of the HBT $Tr_A$ in the amplifier stage is kept constant, this collector current $I_C$ must be previously set at a relatively high level for amplification. In this sixth embodiment, however, since the collector current $I_C$ increases during amplification, it is not necessary to set the collector current $I_C$ in advance, resulting in a reduction in current compensation in the idle time of the power amplifier.

[Embodiment 7]

Figure 10:
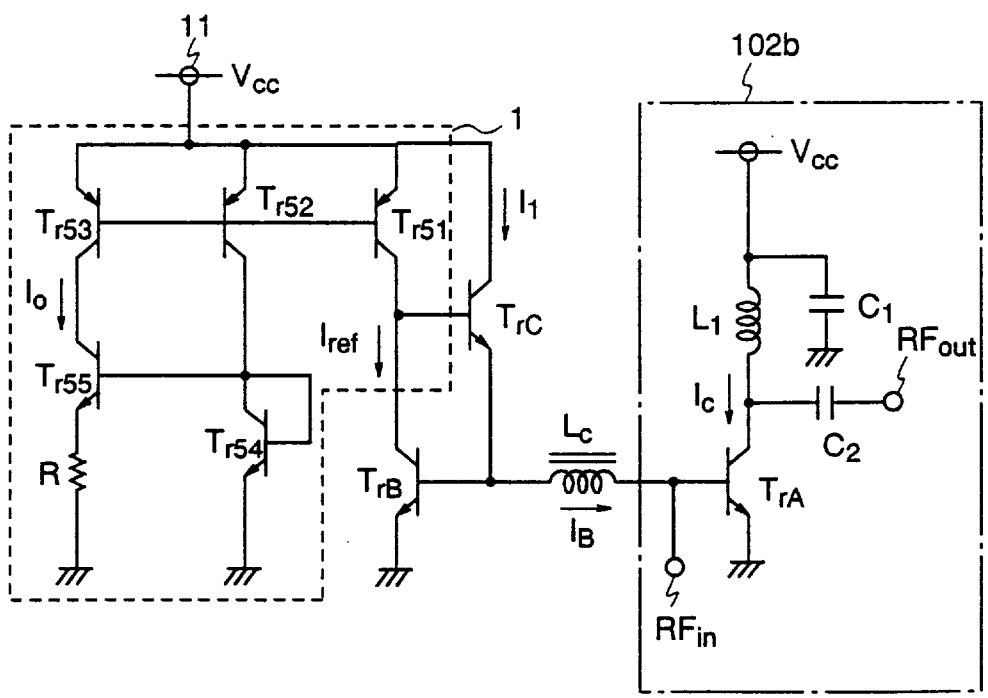
FIG. 10 is a circuit diagram illustrating a power amplifier according to a seventh embodiment of the present invention.

FIG. 10 is a circuit diagram illustrating a power amplifier according to a seventh embodiment of the invention. In FIG. 10, the same reference numerals as those shown in FIGS. 4 and 9 designate the same or corresponding parts. The power amplifier according to this seventh embodiment is identical to the power amplifier according to the fourth embodiment except that an NPN type Si bipolar transistor $Tr_C$ as employed in the sixth embodiment is added. Also in this case, the same effects as those provided by the sixth embodiment are achieved.

[Embodiment 8]

Figure 11:
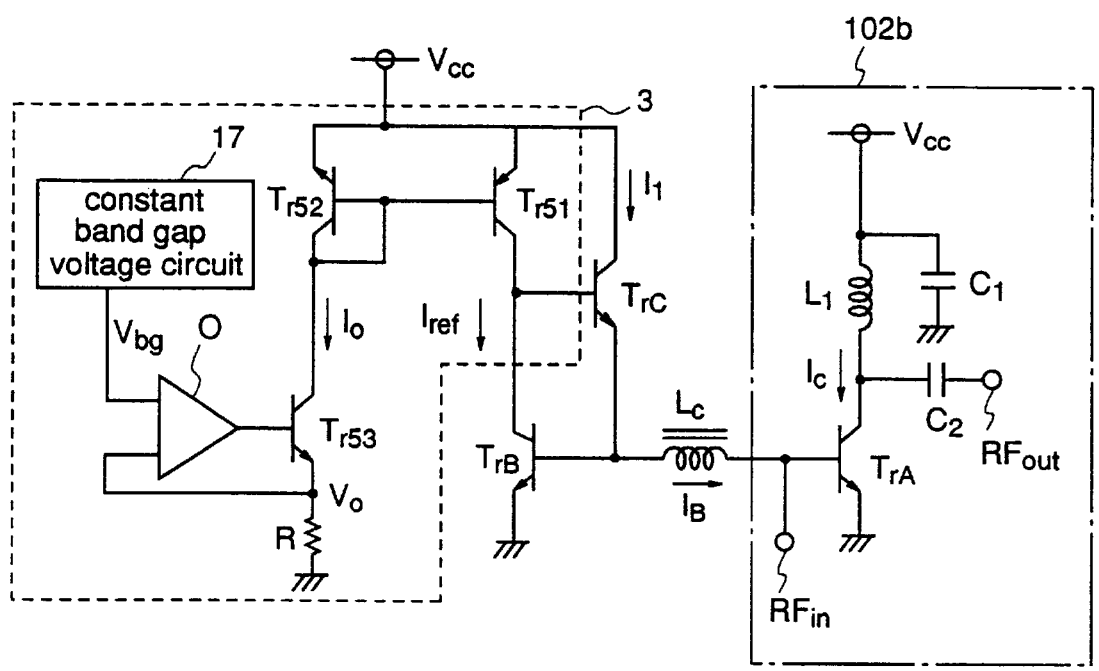
FIG. 11 is a circuit diagram illustrating a power amplifier according to an eighth embodiment of the present invention.

FIG. 11 is a circuit diagram illustrating a power amplifier according to an eighth embodiment of the invention. In FIG. 11, the same reference numerals as those shown in FIGS. 5 and 9 designate the same or corresponding parts. The power amplifier according to this eighth embodiment is identical to the power amplifier according to the fifth embodiment except that an NPN type Si bipolar transistor $Tr_C$ as employed in the sixth embodiment is added. Also in this case, the same effects as those provided by the sixth embodiment are achieved.

In the first to eighth embodiments of the invention, an emphasis has been placed on a power amplifier having an amplifier stage including a single HBT. However, the present invention may be applied to any power amplifier as long as it has an amplifier stage that amplifies a signal using HBT, with the same effects as mentioned above.

What is claimed is:

1. A power amplifier comprising:

an amplifier stage including a first heterojunction bipolar transistor for signal amplification, having a first conductivity type, a base electrode connected to an RF signal input terminal, and a grounded emitter; and a bias circuit including:

a first silicon bipolar transistor having a second conductivity type, and an emitter electrode connected to the power supply terminal; and a second heterojunction bipolar transistor having the first conductivity type, a grounded emitter electrode, a base electrode connected to said base electrode of said first heterojunction bipolar transistor, and a collector electrode connected to said base electrode of said second heterojunction bipolar transistor and to a collector electrode of said first silicon bipolar transistor, and a second silicon bipolar transistor having the second conductivity type, an emitter electrode connected to the power supply terminal, a collector electrode connected to a constant current source, and a base electrode connected to said base electrode of said first silicon bipolar transistor and to said collector electrode of said second silicon bipolar transistor.

2. The power amplifier of claim 1 wherein said constant current source has a current characteristic so that output current is proportional to temperature.

3. The power amplifier of claim 1 wherein said constant current source has a temperature characteristic so that output current does not change in response to changes in temperature.

4. The power amplifier of claim 1 wherein said bias circuit further comprises a third silicon bipolar transistor of the first conductivity type having an emitter electrode connected to said base electrode of said second heterojunction bipolar transistor, a base electrode connected to said collector electrode of said second heterojunction bipolar transistor, and a collector electrode connected to said power supply terminal.

5. The power amplifier of claim 1 wherein the first and second heterojunction transistors are compound semiconductor heterojunction bipolar transistors.

* * * * *